United States Patent [19]

Miyamoto

[11] Patent Number: 4,638,262
[45] Date of Patent: Jan. 20, 1987

[54] PROXIMITY SWITCH WITH IMPROVED RESPONSE TIME AND ANTIMAGNETIC FIELD CIRCUITRY

[75] Inventor: Kiyoshi Miyamoto, Otsu, Japan

[73] Assignee: Omron Tateisi Electronics Co., Kyoto, Japan

[21] Appl. No.: 709,760

[22] Filed: Mar. 8, 1985

[30] Foreign Application Priority Data

Mar. 9, 1984 [JP]  Japan .................................. 59-46155
Mar. 9, 1984 [JP]  Japan .................................. 59-34740

[51] Int. Cl.$^4$ ........................................... G01N 27/00
[52] U.S. Cl. ...................................... 331/65; 324/327; 324/236; 340/686
[58] Field of Search ...................... 331/65, 176, 117 R, 331/183; 324/327, 207, 222, 236; 340/686

[56] References Cited

U.S. PATENT DOCUMENTS 3,747,011  7/1973  Buck .............................. 331/183 X
3,747,012  7/1973  Buck .................................. 331/65
3,805,185  4/1974  Kishi et al. .......................... 331/65
4,001,718  1/1977  Wilson et al. .................... 340/686 X
4,543,527  9/1985  Schuchmann et al. ........... 331/65 X Primary Examiner—Eugene R. LaRoche
Assistant Examiner—D. C. Mis

[57] ABSTRACT

A high frequency oscillation type proximity switch including an oscillating circuit having an adjusting resistor changing the oscillating state, the switch being adapted to detect an object by a decrease in the oscillation output due to the approach of the object, wherein when the oscillation output decreases, the switch detects the object while changing the resistance of the adjusting resistor to facilitate the restart of oscillation. Thus, when the object disappears after the detection of the object, oscillation is easily started, so that response to the detection of objects is improved. Further, by providing the output circuit with an integrating circuit having a time constant greater than the commercial alternating current, the oscillation is caused to be intermittent at the zero-cross point in the alternating current, thus making it possible to construct an anti-magnetic field type proximity switch which is usable even in an environment where an intense ac magnetic field is present.

11 Claims, 6 Drawing Figures

PROXIMITY SWITCH WITH IMPROVED RESPONSE TIME AND ANTIMAGNETIC FIELD CIRCUITRY

BACKGROUND OF THE INVENTION (1) Field of the Invention

The present invention relates to a high frequency oscillation type proximity switch and more particularly to a proximity switch whose response speed at the start of oscillation is improved.

(2) Description of the Prior Art

A high frequency oscillation type proximity switch has a detecting coil installed in a detecting head, said detecting coil being used as an oscillating coil to form an oscillating circuit, an object being detected on the basis of a decrease in the oscillation output. The oscillating circuit used in proximity switches is usually the Hartley oscillating circuit, and the speed at the stoppage of oscillation is changed by adjusting the shape and the number of turns of the oscillating coil and other circuit constants. However, if an approaching object approaches to increase the conductance of the detecting coil, the oscillation will stop sooner or later. Therefore, it may be considered that the response speed of a proximity switch is the total time of the start and stop speeds of oscillation. Generally, the oscillating circuit has a low oscillation rise (start) speed and a very high stop speed. The larger the shape of the detecting coil, the lower the response speed. For example, while a coil with a coil diameter of about 12 mm has a response speed of several hundred KHz, a coil with a coil diameter of about 40 mm has a response speed of several hundred Hz. Thus, conventional proximity switches have the problem that if the coil diameter is large the response speed is low and hence the approach of an object whose rate of change is high cannot be accurately detected.

Further, in an environment where a large current of several ten thousand A flows to produce an intense ac magnetic field as in a resistance welder, the ferrite core of the detecting coil is saturated to increase the detecting coil loss to the extent of stopping the oscillation. Thus, there has been a problem that in such environment it is impossible to use a high frequency oscillation type proximity switch.

SUMMARY OF THE INVENTION

The present invention has been accomplished in view of such problems in the conventional proximity switch and provides a proximity switch which is designed to increase restart speed after the stoppage of oscillation to improve response speed or which can be used in an environment where an intense magnetic field is present.

DESCRIPTION OF THE PREFERRED EMBODIMENTS

The present invention is a high frequency oscillation type proximity switch having an oscillating circuit and a detecting circuit for detecting an object on the basis of a decrease in oscillation output, said oscillating circuit having an adjusting resistor for changing the oscillating state, said proximity switch being characterized by comprising comparing means for comparing the oscillation output from the oscillating circuit with a predetermined level to detect a decrease in said oscillation output, oscillation control means for changing the resistance value of the oscillation adjusting resistor of the oscillating circuit on the basis of the output from the comparing means so as to facilitate oscillation, and oscillation output discriminating means for discriminating the oscillation output from the oscillating circuit on the basis of a predetermined level to provide an output when the oscillation amplitude decreases.

EMBODIMENT 1

Figure 1:
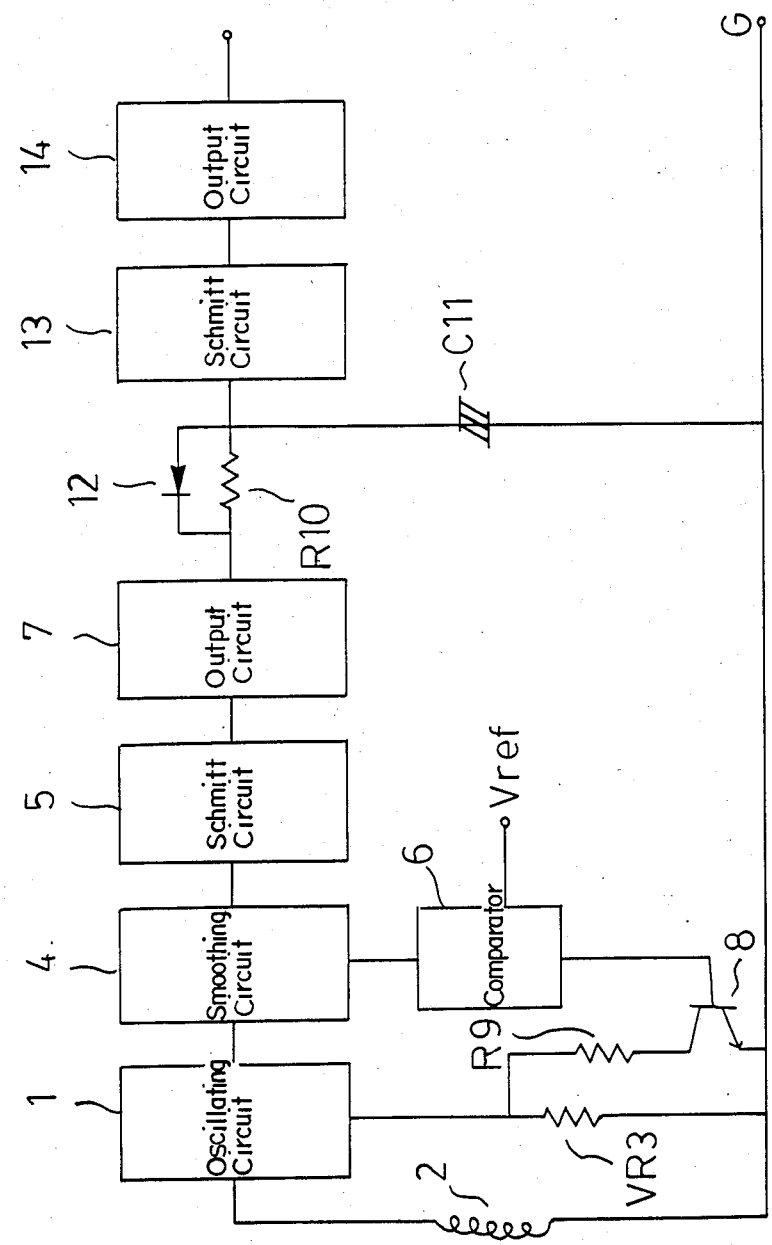
FIG. 1 is a block diagram showing the entire construction of a first embodiment of a proximity switch according to the present invention.

FIG. 1 is a block diagram showing an embodiment of a proximity switch according to the present invention. In this figure, an oscillating circuit 1 has connected thereto a detecting coil 2 and a variable resistor VR3 for adjusting the detection distance of the proximity switch. The oscillation output from the oscillating circuit 1 is imparted to a smoothing circuit 4. The smoothing circuit 4 smooths the output from the oscillating circuit 1 to convert it to a dc voltage having a level corresponding to the size of its amplitude, the output from said smoothing circuit being imparted to Schmitt circuit 5 and to a comparator 6. The Schmitt circuit 5 discriminates the output from the smoothing circuit 4 to convert it to a square waveform, the output therefrom being imparted to an output circuit 7. The comparator 6 has one of its input terminals connected to a reference voltage source having a voltage Vref and compares the output from the smoothing circuit 4 with the reference voltage, the resulting comparison output being imparted to a transistor 8. The transistor 8 is a switching transistor, with its emitter grounded and its collector connected in parallel to a resistor VR3 for detection distance adjustment through a resistor R9, said transistor being adapted to be actuated by the output from the comparator 6 to insert the resistor R9 in parallel, as shown in FIG. 1.

When this proximity switch is to be used as a proximity switch having an increased response speed, the output from the output circuit 7 will be directly used as a detection output for objects, but if it is to be used as an anti-magnetic field type proximity switch, an integrating circuit will be connected to the output circuit 7. The integrating circuit, for example, as shown in FIG. 1, comprises a resistor R10 and a capacitor C11, its time constant selected being greater than the period of the commercial ac voltage, for example, greater than 20 mS. The resistor R10 of the integrating circuit has a diode 12 connected thereacross, the arrangement being such that as soon as the output from the output circuit 7 decreases, the capacitor C11 is discharged. The output from this integrating circuit is imparted to a second Schmitt circuit 13. The Schmitt circuit 13 discriminates the integration output on the basis of a predetermined level to convert it to a square waveform, the output therefrom being imparted to an output circuit 14. The output from the output circuit 14 is delivered to the outside as the proximity switch output.

Figure 2:
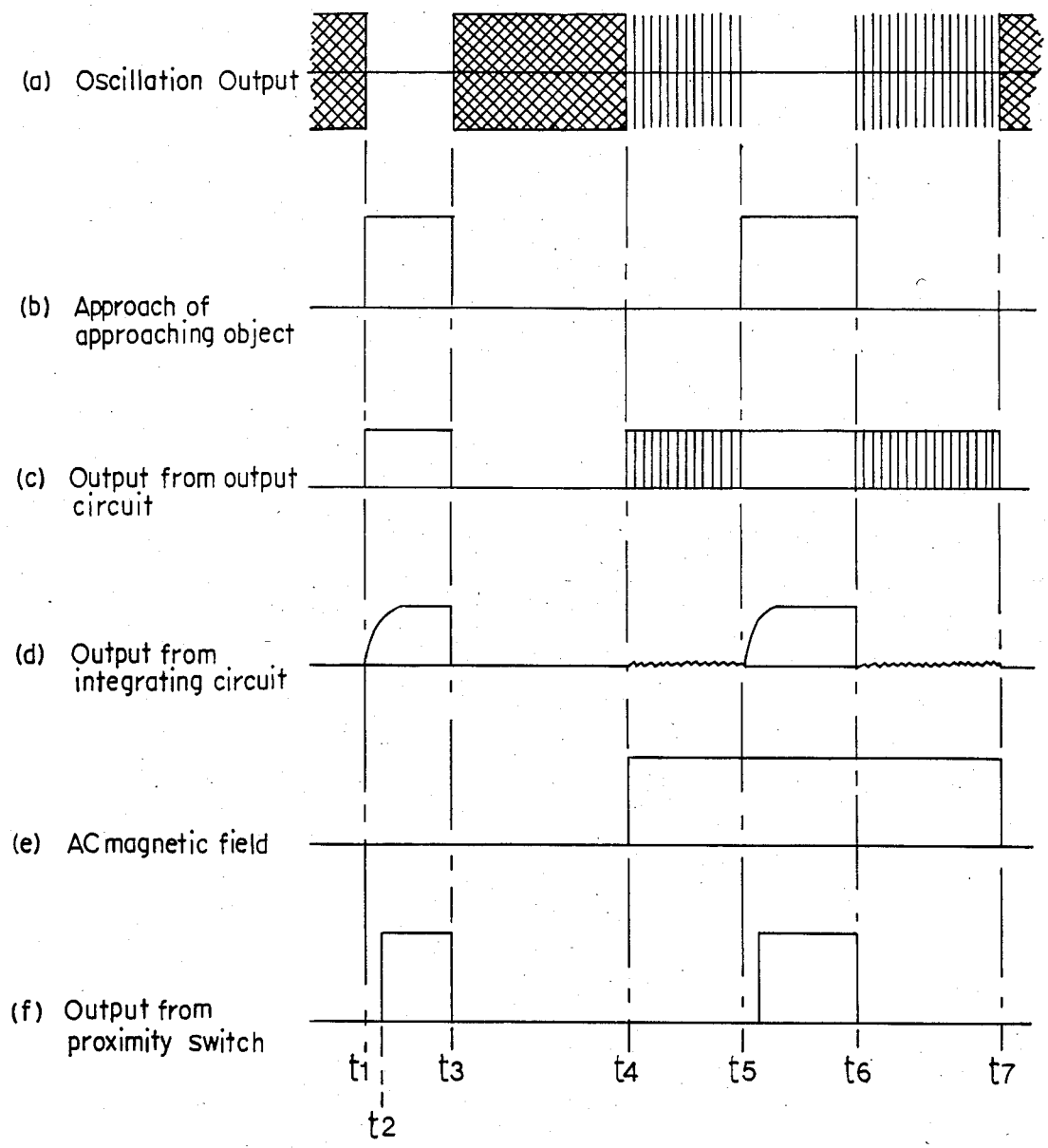
FIG. 2 is a waveform diagram showing waveforms in various portions of the proximity switch of the first embodiment.

The operation of this proximity switch will now be described with reference to the waveform diagrams in FIGS. 2 and 3. FIG. 2(a) is a waveform diagram showing the oscillation output from the oscillating circuit 1; the oscillating circuit is oscillating at a fixed intensity when there is no object in the vicinity of the detecting coil 2. During this time, the output circuit 7 delivers an "L" level output owing to the output from the Schmitt circuit 5, and the capacitor C11 of the integrating circuit has not been charged. Further, since the output from the smoothing circuit 4 imparted to the comparator 6 is greater than the reference voltage Vref, the transistor 8 is OFF, so that the resistor R9 has not been connected in parallel to the detection distance adjusting resistor VR3. If an approaching object approaches during time t1–t3 as shown in FIG. 2(b), the oscillation of the oscillating circuit 1 stops and its change in amplitude is converted to a square waveform by the Schmitt circuit 5, so that during time t1–t3 there is obtained an "H" level output signal from the output circuit 7, as shown in FIG. 2(c). In the case of a proximity switch with an increased response speed, this signal as such is used as an object detection output. In the case where an anti-magnetic field type, as shown in FIG. 1, is formed, the signal from the output circuit 7 is imparted to the integrating circuit comprising the resistor R10 and capacitor C11, and integration is performed as shown in FIG. 2(d). The integration output gradually rises in a curve as shown because of the time constant of CR, but when the capacitor C11 is discharged, it is shorted by the diode 12, so that the output sharply falls at time t3. Since this output is applied to the Schmitt circuit 13 and delivered by the output circuit 14, there is obtained a proximity switch output having a width lasting from time t2, somewhat later than time t1, to time t3, as shown in FIG. 2(f).

Figure 3:
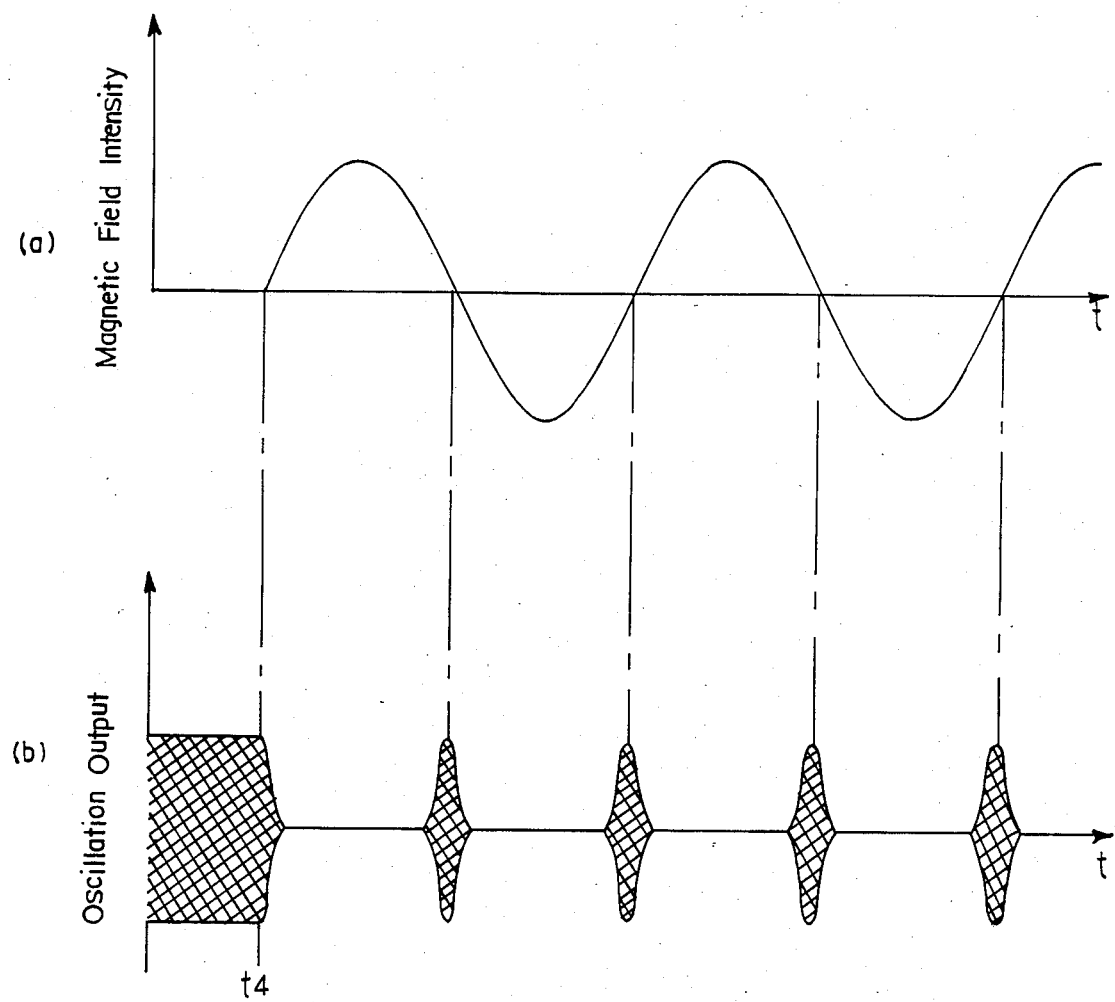
FIG. 3 is a graph showing changes in magnetic field intensity and in oscillation output produced when an ac magnetic field is applied.

If a high ac magnetic field is applied to the proximity switch at time t4 as by the operation of a welder, as shown in FIG. 2(e), the detecting coil 2 will be saturated to increase its conductance if the magnetic field intensity is high, as shown in FIG. 3 in which the time axis is enlarged; thus, the same state is established as when an approaching object contacts the switch, and the oscillation will suddenly stop immediately after time t4. At this time, the output from the smoothing circuit 4 has been imparted to the comparator 6, so that the transistor 8 is driven by the output from the comparator 6 to connect the resistor R9 in parallel to the detection distance adjusting resistor VR3. As a result, the conductance of the detecting coil is increased to facilitate the start of oscillation. Thus, oscillation can easily take place if the zero-cross point in the ac magnetic field is approached as shown in FIG. 3(a), (b), so that oscillation is quickly started. Thus, in the case of application of an ac magnetic field of, for example, 60 Hz, there will be obtained a burst waveform wherein the oscillation is intermittent at twice the frequency, or 120 Hz. The waveform at and after time t4 in FIG. 2(a) shows this state. Since this burst waveform is shaped and applied to the output circuit 7, the latter produces a signal which assumes "L" level at each burst oscillation. However, in the integrating circuit, a fixed time which is determined by the time constant of CR is required for charging, while discharging is instantaneously effected, so that, as shown in FIG. 2(d), the integration output does not increase and no output is obtained from the output circuit 14. If an approaching object approaches at time t5, oscillation cannot occur even in the vicinity of the zero-cross in the ac magnetic field and the oscillating circuit 1 stops oscillating. Therefore, there is no possibility of the outuput from the output circuit 7 decreasing to "L" level, and the output from the integrating circuit increases as shown in FIG. 2(d), so that a detection signal as shown in FIG. 2(f) is obtained from the integrating circuit 14. If the approaching object disappears at time t6, the oscillating circuit 1 intermittently oscillates, so that the output from the integrating circuit assumes "L" level and hence no further output is produced from the output circuit 14.

In the present embodiment implemented as the anti-high magnetic field types as described above, by operating the oscillating circuit at the zero-cross point in an ac magnetic field, it becomes possible to operate the proximity switch even in a high magnetic field. If the ac magnetic field stops being applied at time t7, the oscillating circuit 1 begins to oscillate continuously, and since it will stop oscillating on the approach of the approaching object, the latter can be detected.

In the present embodiment, an integrating circuit is disposed in the post-stage of the output circuit 7. If the output from the output circuit 7 is directly used as the object detection output from the proximity switch, the response speed is increased, making it possible to detect a fast-moving object. That is, if the oscillation stops owing to the approach of the object, the output form the smoothing circuit 4 is decreased, but this output is imparted to the comparator 6, whose output then turns the transistor 8 ON. Thus, the resistor R9 is connected in parallel to the variable resistor VR3 to facilitate the start of oscillation. Therefore, the response speed, which is the total time of the start and stop speeds of oscillation, is increased, making it possible to detect the approach of an object whose rate of change is high.

EMBODIMENT 2

Figure 4:
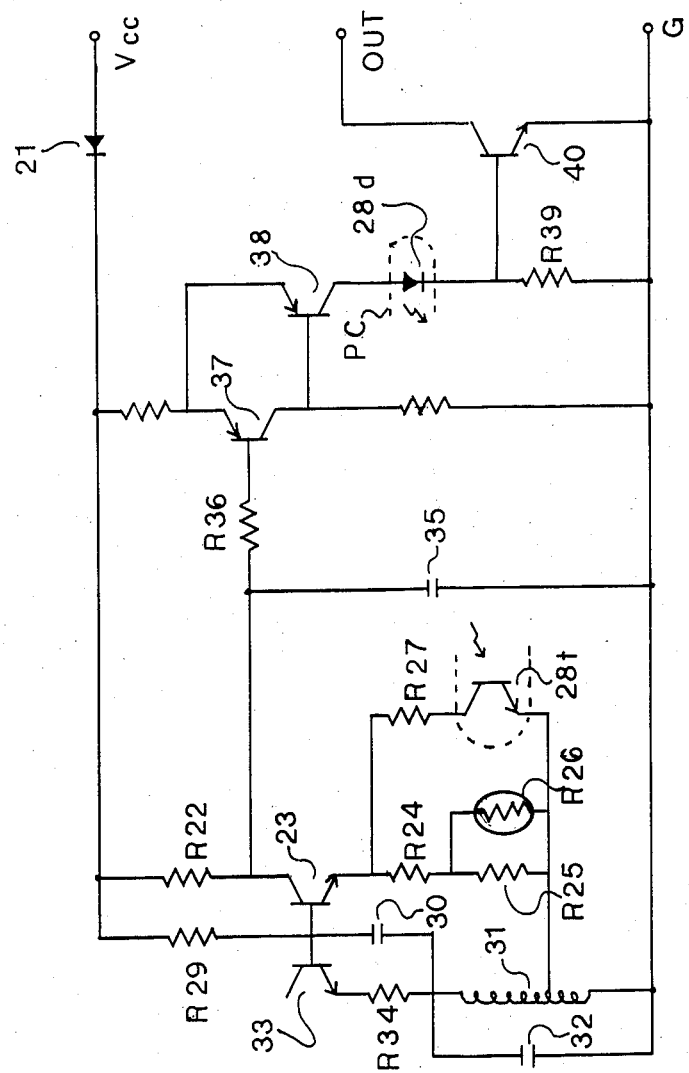
FIG. 4 is a circuit diagram of a second embodiment of a proximity switch according to the present invention.

FIG. 4 is a circuit diagram showing the oscillating circuit of a proximity switch of a second embodiment of the present invention. In this figure, connected to a power source terminal Vcc through a diode 21 and a collector resistor R22 is a transistor 23 forming an oscillating circuit. Feedback resistors R24 and R25 are connected in series to the emitter of said transistor. A temperature-sensitive resistor R26 such as a temperature compensation thermistor is connected in parallel to the resistor R25, and a resistor R27 and an output transistor 28t for a photocoupler PC are connected in parallel to the resistors R24 and R25. The resistor R27 corresponds to the resistor R9 in the first embodiment and the output transistor 28t to the transistor 8 in the first embodiment. A bias resistor R29 from the power source is connected to the base of the transistor 23, and a resonance circuit comprising a detecting coil 31 and a capacitor 32 is also connected thereto through a capacitor 30. Further, the base and emitter of a transistor 33 having the same characteristic as the transistor 23 and a resistor R34 are connected in parallel to the capacitor 30. The common connection end of the feedback resistors R25 and R26 and photocoupler transistor 28t is connected to the intermediate tap of the detecting coil 31 to form a feedback circuit. The collector of the transistor 23 is grounded through a smoothing capacitor 35, the smoothed output being imparted to the base of a transistor 37 through a resistor R36. The transistors 37 and 38 correspond to the Schmitt circuit 5 and comparator 6 of the first embodiment described above and serve to discriminate changes in the oscillation output level to provide digital outputs. The collector of the post-stage transistor 38 has connected thereto a light-emitting diode 28d and collector resistor R39 for the photocoupler PC, the common connection end thereof having an output transistor 40 connected thereto.

Figure 5:
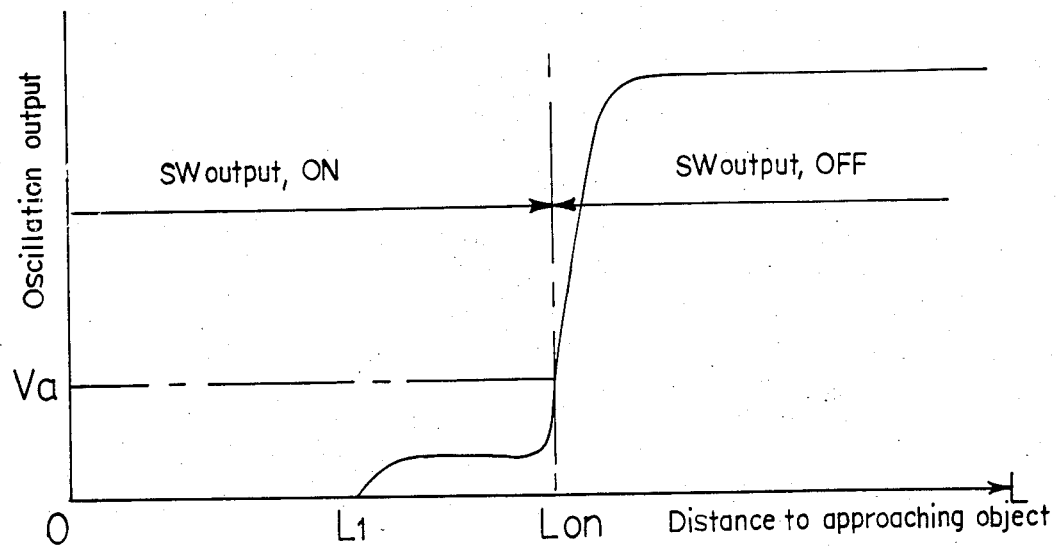
FIG. 5 is a graph showing changes in oscillation amplitude produced when an object approaches a conventional proximity switch.
Figure 6:
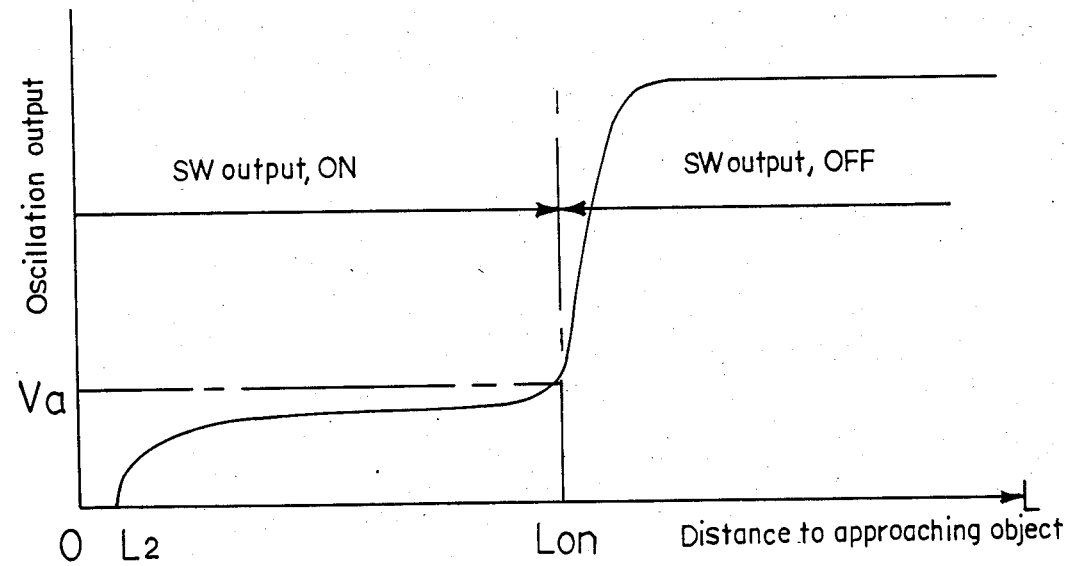
FIG. 6 is a graph showing changes in oscillation amplitude relative to the distance of a moving object in the oscillating circuit of the proximity switch of the second embodiment.

The operation of the proximity switch of the present embodiment will now be described. FIGS. 5 and 6 are graphs showing oscillation amplitude with respect to the distance between an approaching object and a detecting coil in oscillating circuits of the prior art and the present embodiment, respectively. In these figures, when an approaching object is sufficiently away from the detecting coil 31, the oscillation amplitude is constant in each case, and as the approaching object approaches, the oscillation amplitude sharply decrease. When the oscillation amplitude falls below a predetermined threshold level Va, the proximity switch detects the object and produces an output. In the case of the prior art proximity switch, as shown in FIG. 5, as soon as an approaching object approaches slightly from the detection distance Lon to reach distance L1, the oscillation is stopped.

On the other hand, in the present embodiment, if the power is applied to actuate the oscillating circuit when there is no object in the vicinity of the detecting coil 31, the output on the hot end side of the detecting coil 31 is amplified by the transistor 23 and with positive feedback effected it starts to oscillate. At this time, the amplitude of oscillation can be changed by the feedback resistance determined by the resistors R24, R25 and R26. In the normal oscillating state, the oscillation output is smoothed by the smoothing capacitor 35 and imparted to the trasistor 37, so that the latter is turned ON and the voltage across the base and emitter of the transistor 38 is low, turning the transistor OFF. Thus, since the light-emitting diode 28d of the photocoupler PC is OFF, the photocoupler transistor 28t is non-conductive, so that the resistor R27 has not been inserted in the feedback circuit.

When an object approaches, the output amplitude of the oscillating circuit decreases, as shown in FIG. 6, and the level of the output smoothed by the capacitor 35 lowers. When distance Lon is reached, the output to be imparted to the Schmitt circuit lowers to turn the transistor 37 OFF. Then, the transistor 38 is turned ON, causing the light-emitting diode 28d of the photocoupler PC to fire, rendering the photocoupler transistor 28t conductive, so that the resistor R27 is connected in parallel to the resistors R24 and R25. Therefore, the feedback resistance of the oscillating circuit decreases to facilitate oscillation. It is to be noted that the oscillation level at this time is so determined that it is not higher than the threshold level Va of the Schmitt circuit. With this arrangement, even if an approaching object further approaches the detecting coil 31, as shown in FIG. 6, the oscillation level will not change so much and the oscillation will stop when the distance between the object and the detecting coil 31 is L2. Thus, when the approaching object is between distances L2 and Lon, the oscillation will not stop but if the object exceeds distance Lon again, the oscillation output goes over the threshold level Va, so that the proximity switch produces an output and simultaneously the Schmitt circuit is reversed. Then, the light-emitting diode 28d of the photocoupler PC is put out, turning the transistor 28t OFF, so that the resistor R27 is separated from the feedback circuit to increase the feedback resistance. With this arrangement, since there is no possibility of the oscillation being stopped, the response speed can be improved without passing through the rise time of oscillation. When the approaching object further approaches the detecting coil 31 to interrupt the oscillation, the oscillation is restarted with the distance between the object and the detecting coil 31 exceeding L2, so that the response speed is independent of the rise time of oscillation, thus making it possible to improve the response speed of the proximity switch.

While the present embodiment uses a Schmitt circuit comprising transistors 37 and 38, the output from said circuit being used as the object detection output of the proximity switch, and the feedback resistance of the oscillating circuit is made variable through a photocoupler, it is possible to separately construct the Schmitt circuit for object detection output and the comparing circuit for determining the level which changes the feedback resistance, as in the case of the first embodiment, so that the respective operating levels may differ.

While this embodiment is a proximity switch whose response speed is improved, the output from the transistor 40 may be imparted to an integrating circuit as in the case of the first embodiment, the integration output being delivered as the object detection output to the outside through a Schmitt circuit and an output circuit. Then, it can be used as an anti-magnetic field type proximity switch, as in the case of the first embodiment.

Thus, in the present invention, the response speed is improved by changing the adjusting resistance and feedback resistance of the oscillating circuit according to the oscillating state and ensuring that if the oscillation level lowers, the oscillation is further facilitated. Therefore, objects moving at high speeds can be easily detected. If the output is imparted to an integrating circuit having a time constant greater than the period of the commercial ac power source to detect an object on the basis of the integration output, even in cases where an intense ac magnetic field is also applied to the proximity switch to cause the proximity switch to stop oscillating, oscillation does take place at the zero-cross point in the commercial alternating current, so that oscillation can be caused to proceed intermittently; thus, an anti-magnetic field type proximity switch can be constructed.

I claim:
1. A high frequency oscillation type proximity switch having an oscillation circuit with an oscillation output and a detecting circuit for detecting an object by a decrease in the oscillation output,
   wherein said oscillating circuit has an oscillation adjusting resistor for changing the oscillation amplitude,
   said proximity switch comprising
   comparing means for comparing the oscillation output from said oscillating circuit with a predetermined level to detect the decrease therein,
   oscillation control means for changing the resistance of the oscillation adjusting resistor of said oscillating circuit on the basis of the output from said comparing means, oscillation output discrimination means for discriminating the oscillation output from said oscillating circuit on the basis of a predetermined level to provide an output when the oscillation amplitude lowers, and an integrating circuit for integrating the output from said output discrimination means and providing an output on the basis of which the switch detects an object.

2. A proximity switch as set forth in claim 1, wherein the adjusting resistor of said oscillating circuit is a proximity switch detection distance adjusting resistor.

3. A proximity switch as set forth in claim 2, wherein said oscillation control means has a resistor which is connected in parallel to the detection distance adjusting resistor of said oscillating circuit and which is adapted to be connected and disconnected by the output from said comparing means.

4. A proximity switch as set forth in claim 1, wherein the integrating circuit has a time constant which is greater than the period of commercial alternating current.

5. A proximity switch as set forth in claim 1, wherein said integrating circuit has an integrating capacitor and a resistor, and a discharging diode is connected across said resistor.

6. A proximity switch as set forth in claim 1, wherein said oscillating circuit is a Harley type oscillating circuit and the adjusting resistor of said oscillating circuit is a feedback resistor.

7. A proximity switch as set forth in claim 6, wherein said oscillation control means has a light-emitting element driven by the output from said comparing circuit, a resistor connected in parallel to the feedback resistor of said osillating circuit, and a series-connected control body for a light-receiving element driven by said light-emitting element.

8. A proximity switch as set forth in claim 7, wherein the light-emitting element and light-receiving element of said oscillation control means are a light-emitting diode and a phototransistor, respectively, and are formed as a photocoupler.

9. A proximity switch as set forth in claim 6, wherein said comparing means and said oscillation output discriminating means are integrally constructed and adapted to produce an output on the basis of a decrease in the oscillation output.

10. A proximity switch as set forth in claim 6, wherein the integrating circuit has a time constant which is greater than the period of commercial alternating current.

11. A proximity switch as set forth in claim 4, wherein said integrating circuit has an integrating capacitor and a resistor, and a discharging diode is connected across said resistor.

* * * * *